United States Patent [19]

Asano et al.

[11] Patent Number: 5,532,840
[45] Date of Patent: Jul. 2, 1996

[54] FACSIMILE MACHINE

[75] Inventors: Yuji Asano; Wataru Tomida, both of Nagoya, Japan

[73] Assignee: Brother Kogyo Kabushiki Kaisha, Nagoya, Japan

[21] Appl. No.: 171,420

[22] Filed: Dec. 22, 1993

[30] Foreign Application Priority Data

Dec. 29, 1992 [JP] Japan ................................. 4-360545
Dec. 29, 1992 [JP] Japan ................................. 4-360546
May 17, 1993 [JP] Japan ................................. 5-139385

[51] Int. Cl.$^6$ ........................................ H04N 1/21
[52] U.S. Cl. ................... 358/404; 358/444; 358/468; 379/100
[58] Field of Search ........................ 358/402, 444, 358/404, 468; 379/100; 395/183.18, 185.07; 365/200, 201; 371/5.1

[56] References Cited

U.S. PATENT DOCUMENTS 5,438,428  8/1995  Itoh ............................ 358/444

FOREIGN PATENT DOCUMENTS 191560  8/1989  Japan ................................. H04N 1/21
286671  11/1989 Japan ................................. H04N 1/21

Primary Examiner—Scott A. Rogers
Attorney, Agent, or Firm—Oliff & Berridge

[57] ABSTRACT

In this facsimile machine, it is determined whether data to be stored in a RAM is image data, and, if the data is image data, a normal cluster for writing the image data into is ensured. If the data is not image data, a defective cluster is selected, and the data is written into the defective cluster. In this case, if no defective cluster is selected, a normal cluster is selected, and the data is written into the normal cluster. Upon termination of the data writing operation, the data is managed on a classification (kind) basis. Accordingly, a facsimile machine is provided that is low in price and can easily carry out individual management for preservation of data while maintaining preservation (storage) quality of data even when a semiconductor memory that is not guaranteed in quality is used as the storage medium for the data.

15 Claims, 14 Drawing Sheets

FACSIMILE MACHINE

BACKGROUND OF THE INVENTION

1. Field of the invention

This invention relates to a facsimile machine and, more particularly, to a facsimile machine in which voice data and image data can be stored in a semiconductor memory.

2. Description of Related Art

Conventionally, facsimile machines are equipped with both magnetic tape and random access memory (RAM) as storage mediums for storing voice data such as a reception message (In Coming Message: hereinafter referred to as "ICM"), a transmission message (Out Going Message: hereinafter referred to as "OGM"), etc., and image data.

FIG. 14 is a block diagram showing the main construction of a control unit for the conventional facsimile machine as described above. The main body of the control unit is a microcomputer 35 comprising a CPU 31, a RAM 32 and a ROM 33. The microcomputer 35 is connected to a reader 36 for reading out image data of a transmission original and a recorder 39 for recording received image data on a sheet, etc. The microcomputer 35 is further connected to a modem 42. The modem 42 is connected to a telephone line 44 through a network control unit (hereinafter referred to as "NCU") 43. The modem 42 is used to enable the facsimile machine to carry out intercommunication (transmission and reception) of voice data and image data with another facsimile machine using the telephone line. The NCU 43 is provided with a switch (hereinafter referred to as "SW") 50, and the SW 50 is connected to a hand set 45 having a built-in microphone, a speaker 46, a voice IC 47 and a magnetic tape 48. The data input and output operations between the above elements are controlled through a switching operation of the SW 50. The voice IC 47 is connected to a RAM 49 that is exclusively used for the voice data.

In the facsimile machine thus constructed, the OGM, which is voice data, is first recorded in an analog form on the magnetic tape 48 through the microphone of the hand set 45. Upon power-on of the facsimile machine, the recorded voice data is transferred from the magnetic tape 48 through the voice IC 47 to the exclusive RAM 49 to be stored in a digital form. The voice data transferred to the RAM 49 is reproduced by the voice IC 47 if occasion demands.

The ICM, which is voice data, and the image data transmitted through the telephone line 44 are stored on the magnetic tape 48 and reproduced from the magnetic tape 48 if occasion demands. As described above, the voice data and the image data are stored on the magnetic tape 48 and in the RAM 49, and a work stack area is kept in the RAM 32.

However, in the conventional facsimile machine, a random access cannot be carried out for the magnetic tape. Therefore, if a user wants to take out a specific image data or voice data, it takes a long time to wait for the take-out of the specific data (i.e., it takes a long stand-by time). Thus, the user cannot immediately take out the desired data. Accordingly, the conventional facsimile machine has a low working efficiency. In addition, with respect to the magnetic tape, the tape length to be allocated to the voice data and the image data is varied according to individual data. So, it is difficult to individually erase the voice data and the image data and store only specific data. Further, use of both of the magnetic tape and the RAM as the storage medium for data necessarily needs a tape driving mechanism, a tape driving control unit, an IC that is exclusively used to reproduce OGM, an exclusively used RAM for OGM and a RAM for a work stack. So, the construction of the facsimile machine is more complicated.

SUMMARY OF THE INVENTION

An object of this invention is to provide a facsimile machine in which a random access for data can be carried out at high speed with a simple construction by storing both voice data and image data into a random-accessible RAM.

Another object of this invention is to provide a low-price facsimile machine that can easily carry out an individual data storing management and suffers no adverse effects in data storage quality by devising the data storage management, even with a large-capacity semiconductor memory having no quality assurance, and can be obtained at low price.

To attain the above and other objects, the facsimile machine according to this invention includes a semiconductor memory capable of storing voice data and image data, first management means for dividing the semiconductor memory on a cluster basis and managing identification information for each cluster. The machine also has setting means for setting, on the basis of the information of the first management means, one or plural clusters used when data is stored in the semiconductor memory, and second management means for managing a file comprising the clusters set by the setting means on a data-classification basis (according to the classification of data).

In the facsimile machine thus constructed, the first management means divides the semiconductor memory on a cluster basis and manages the identification information for each cluster. The setting means sets one or plural clusters to be used when the data is stored in the semiconductor memory on the basis of the information managed by the first management means. The second management means manages the file comprising the set clusters on a data-classification basis so that the file can be individually erased or only a specific data can be preserved.

According to the facsimile machine of this invention, by storing both of the voice data and the image data into the random-accessible RAM, access speed becomes high, and, thus, the working efficiency is improved. In addition, the construction of the machine is simplified. Further, the selection of clusters used to store data is carried out according to a classification (kind) of the data. So, even if a cheap RAM that is partially bit-defective is used as a storage medium for storing the voice data or image data, high data storage (keeping) quality can be maintained. Further, the data stored in the RAM is managed on a data-classification (kind) basis. Thus, the data management, such as the individual erasing of data and preservation of only specific data, etc., can be easily carried out.

BRIEF DESCRIPTION OF THE DRAWINGS

Preferred embodiments of the present invention are described in detail referring to the following figures wherein.

DETAILED DESCRIPTION OF PREFERRED EMBODIMENTS

Figure 1:
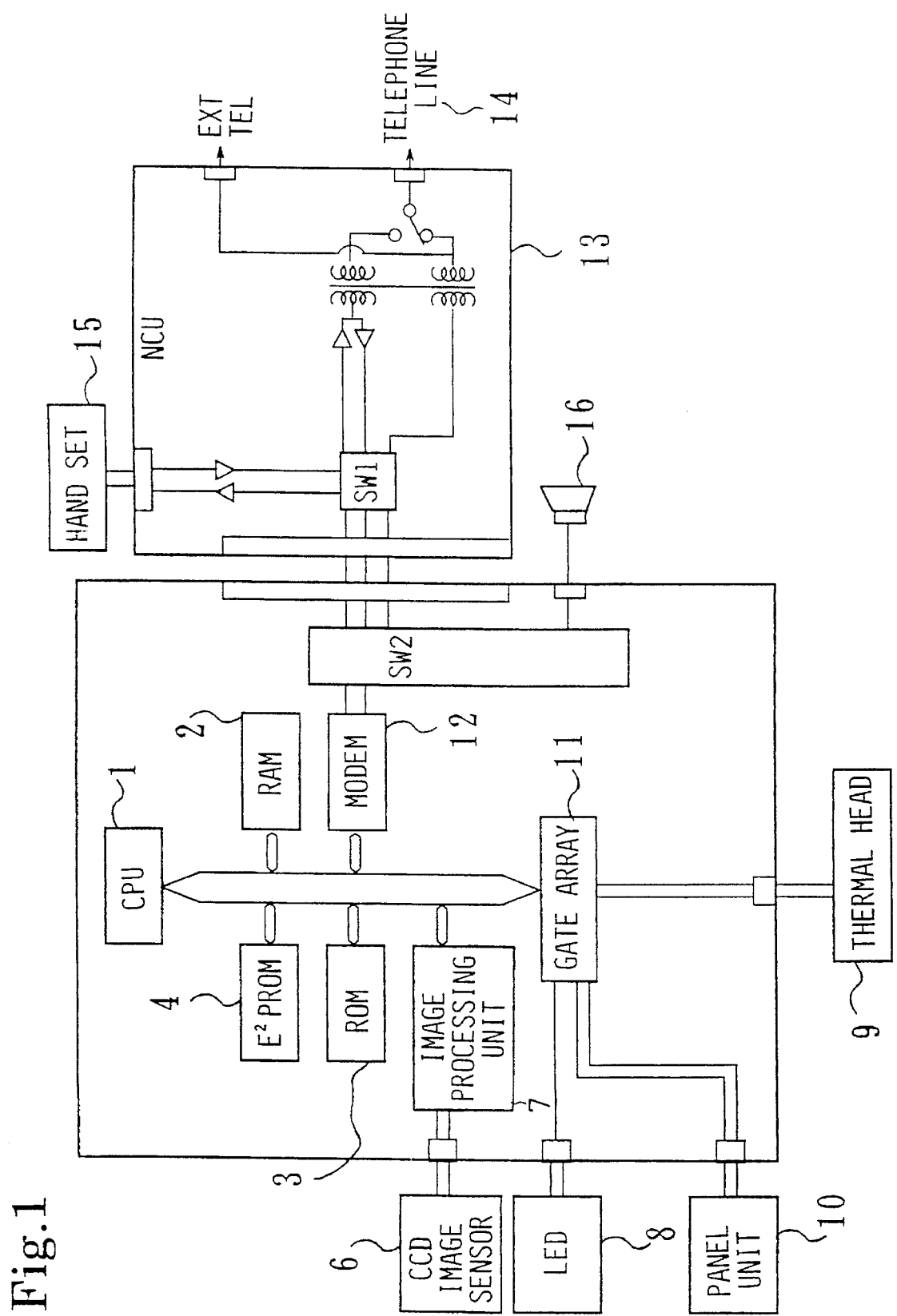
FIG. 1 is a block diagram showing the main construction of a control unit for a facsimile machine according to an embodiment of this invention.

First, a control unit for a facsimile machine according to an embodiment of this invention is described referring to FIG. 1. The main portion of the control unit comprises a CPU 1, a RAM 2, a ROM 3 and an EEPROM 4 (also known as E²PROM). The CPU 1 is connected through an image processing unit 7 to a CCD image sensor 6 for reading out image data of a transmission original. The CPU 1 is further connected through a gate array 11 to an LED 8 serving as a read-out light source, a thermal head 9 for recording received image data on a sheet, and a panel unit 10 for carrying out a key input operation. Since this facsimile machine carries out transmission and reception of voice data and image data using a telephone line, the CPU 1 is connected to a modem 12, which is further connected through a NCU 13 to a telephone line 14. The NCU 13 is provided with a SW1, and data input through the telephone line is input to the modem 12 side by switching the SW1 from a hand set 15 side to the modem 12 side. A SW2 is interposed between the modem 12 and the NCU 13, and the modem 12 is selectively connected to any one of the speaker 16 and NCU 13 through a switching operation of the SW2.

Figure 2:
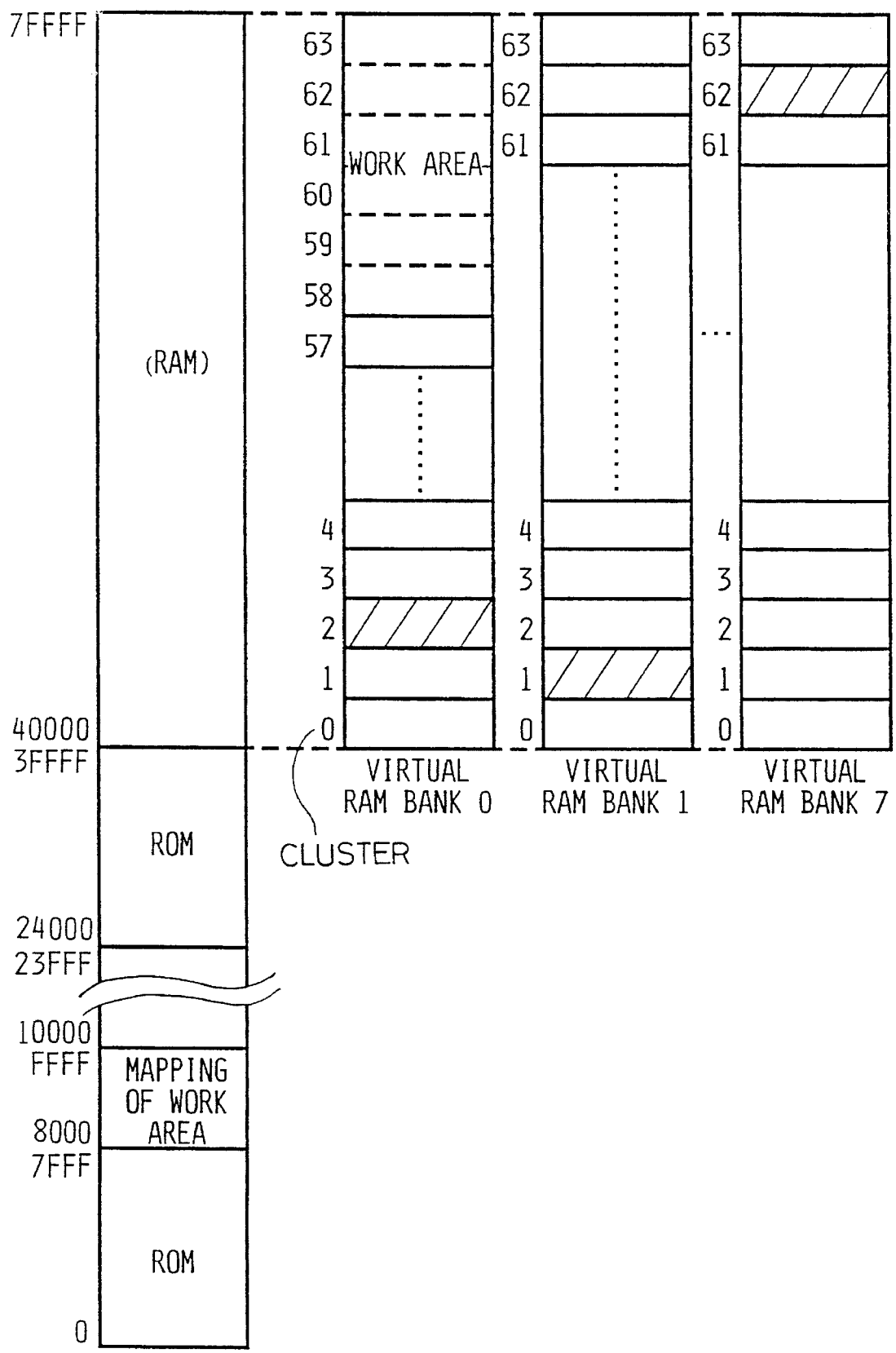
FIG. 2 is a schematic diagram showing a map of a RAM in this embodiment.

FIG. 2 shows a memory map of the CPU 1. As shown in FIG. 2, the ROM 3 is allocated addresses of 0 to 7FFF and addresses of 24000 to 3FFFF. The RAM 2 is allocated addresses of 40000 to 7FFFF. The RAM 2 of this embodiment has a 2 mega-byte area, and the area is physically divided into eight 256K-byte logical spaces (banks) (bank numbers: 0 to 7). Each of the banks is selectively used through a bank switching operation. Each bank is divided on a 4K-byte cluster basis, and one bank comprises 64 clusters (cluster numbers: 0 to 63). The eight logical spaces of 256K-bytes are called "physical RAM banks" for the respective banks that are physically determined. The virtual RAM banks are obtained by arbitrarily changing the order of the physical RAM banks. The virtual RAM banks 0 to 7 are selectively allocated at the addresses of 40000 to 7FFFF. A 32K-byte area (cluster numbers: 56 to 63, addresses of 78000 to 7FFFF) at the most significant address of the virtual RAM bank 0 is kept as a work area. The work area is so designed that a portion corresponding to the addresses of 78000 to 7FFFF of the virtual RAM bank 0 is automatically accessed by hardware that also accesses the addresses of 8000 to FFFF (the addresses of 8000 to FFFF are called a work area mapping).

If a work area is located at the virtual RAM banks 0 to 7, the access to the work area could not be performed when a bank switching operation is carried out. The work area mapping is provided to prevent the inaccessibility to the work area as described above. Therefore, in this embodiment, the read-out and write-in operations can be carried out at all times when any virtual RAM bank is accessed. If at least a part of the bits of the work area is abnormal, data treatment or processing such as a calculation processing that is carried out in the work area cannot be accurately executed. So, an error occurs in the data, and an inaccurate result is obtained. Accordingly, for use of the RAM 2, it is first required to check whether a work area can be ensured in an area where all bits are normal.

Figure 3:
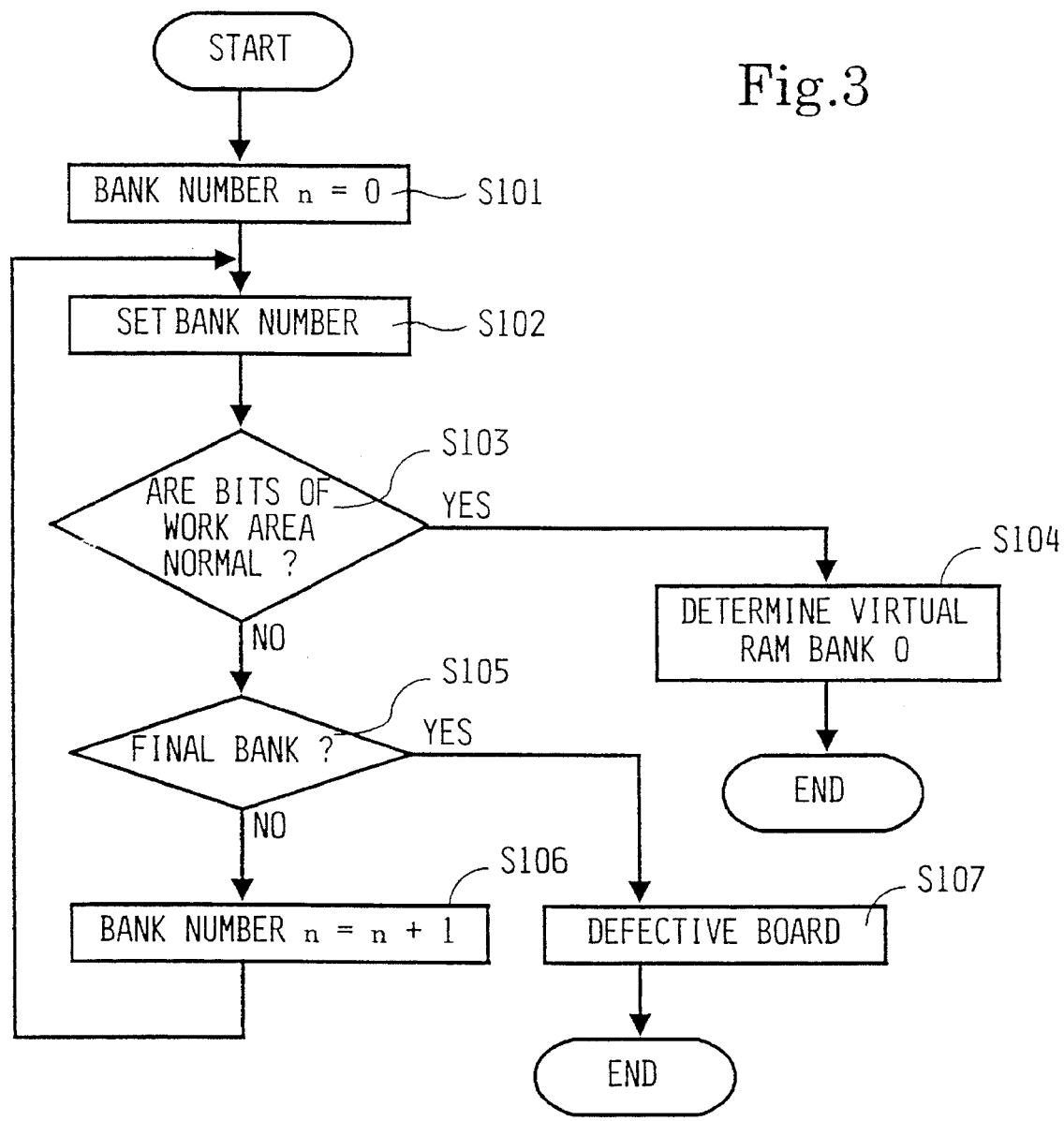
FIG. 3 is a flowchart for a virtual RAM bank determining operation in this embodiment.

The operation of determining the virtual RAM bank "0" in the RAM 2 is described referring to FIG. 3. The determination of the virtual RAM bank 0 is carried out by switching the physical RAM bank while setting the bank number of the physical RAM bank into an I/O for presuming a virtual RAM bank 0 (hereinafter referred to as "0-bank presuming I/O").

First, the CPU 1 sets a bank number n to "0" (S101) and sets the bank number "0" in the 0-bank presuming I/O (S102). Subsequently, the CPU 1 determines whether the 32K-byte bits at the most significant address of the bank number "0" are normal (S103). If the CPU 1 determines that all the bits are normal (S103: Yes), the CPU 1 ensures the 32K-byte area at the most significant address of the bank number "0" as a work area and determines the bank as a virtual RAM bank "0" (S104). On the other hand, if the CPU 1 determines that any defective bit exists in the 32K-byte bits at the most significant address of the bank number "0" (S103: No), the CPU 1 determines whether the bank is the final bank (S105). If the CPU 1 determines that the bank is not the final bank (S105: No), the CPU 1 adds the bank number n with "1" (S106) to set the bank number "1" in the 0-bank presuming I/O (S102). Subsequently, the CPU 1 repetitively carries out the above operation until a 32K-byte area at the most significant address of any bank can be ensured as a work area.

On the other hand, if the CPU 1 determines that the bank is the final bank (C105: Yes), the 32K-byte areas at the most significant addresses of all banks having bank numbers "0" to "7" are determined to be abnormal, so that the RAM 2 is treated as a defective board (S107).

Figure 4:
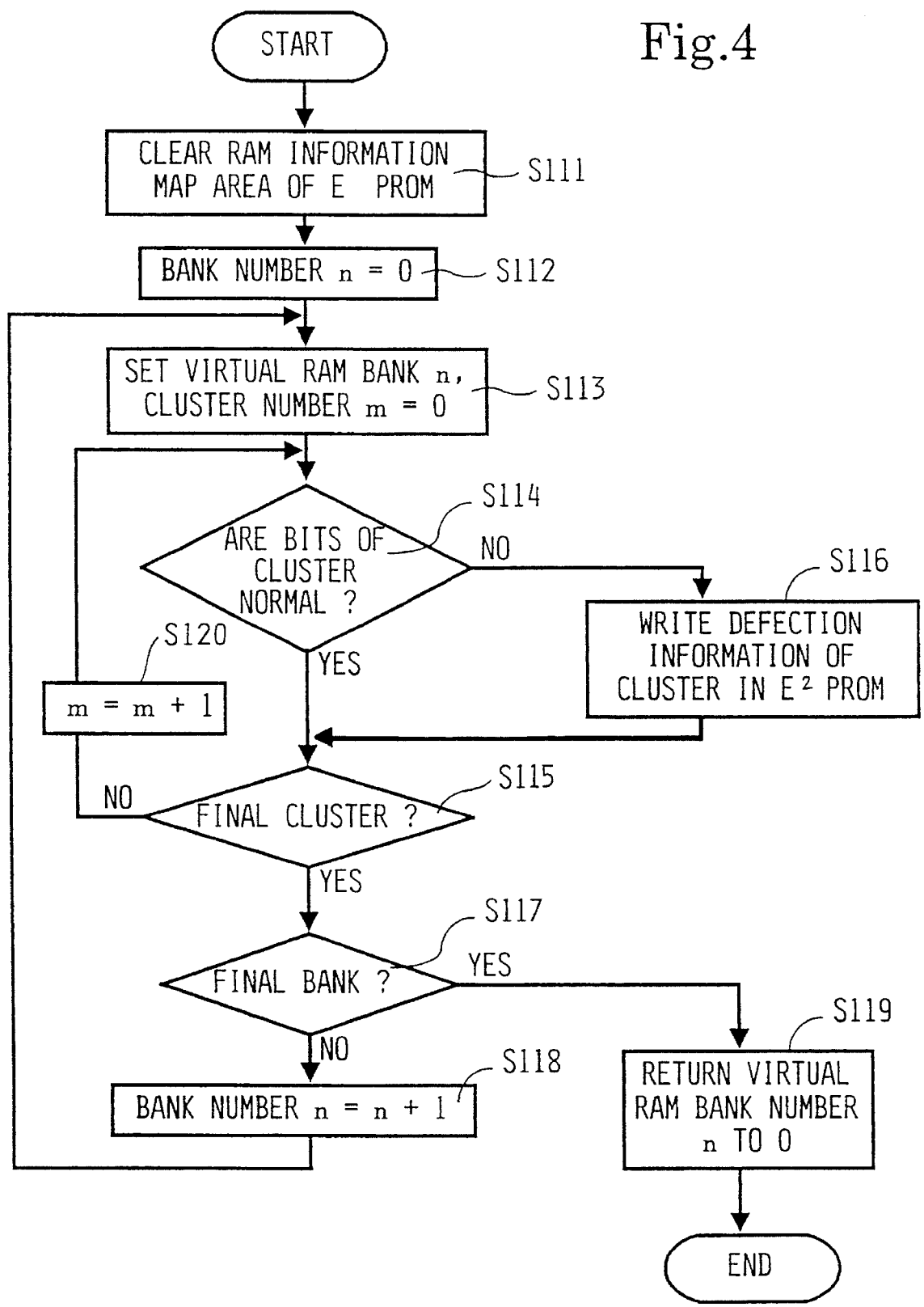
FIG. 4 is a flowchart for a write-in operation into a RAM information map area in this embodiment.

After the virtual RAM bank "0" is determined through the above operation, the CPU 1 determines whether all bits are normal in every cluster in a storage area excluding the work area by setting the bank number in a virtual RAM bank switching I/O. Subsequently, the CPU 1 writes the presence or absence of defective bits in a RAM information map area of the EEPROM 4. The write-in operation into the RAM information map area is described referring to FIG. 4.

The CPU 1 clears the RAM information map area of the EEPROM 4. That is, the CPU 1 sets "0" to each bit of the RAM information map area of the EEPROM 4 (S111). Subsequently, the CPU 1 sets the bank number n to "0" (S112),sets the virtual RAM bank "0" in the virtual bank switching I/O, and sets the cluster number m to "0" (S113). Thereafter, the CPU 1 determines whether all bits of the cluster number "0" are normal in the virtual RAM bank "0" (S114). If the CPU 1 determines that all bits of the cluster number "0" are normal in the virtual RAM bank "0" (S114: Yes), the CPU 1 keeps to "0" the bits corresponding to the cluster number "0" of the virtual RAM bank "0" of the RAM information map area of the EEPROM 4 and determines whether the cluster is the final cluster (S115).

If the CPU 1 determines that the cluster is not the final cluster (S115: No), the CPU 1 adds the cluster number m with "1" (S120) and returns to the step S114 to determine whether all bits of the cluster number "1" are normal. Subsequently, the CPU 1 successively checks all the clusters through the final cluster.

On the other hand, if the CPU 1 determines that at least one bit in a cluster is not normal (S114: No), the CPU 1 sets "1" to the bits corresponding to the cluster number of the RAM information map area of the EEPROM 4(S116) and then returns to the step S115. Upon termination of the check of any defective bit of the final cluster (S115: Yes), the CPU 1 determines whether the bank is the final bank, that is, the bank number "7" (S117). If the CPU 1 determines that the bank is not the final bank (S117: No), the CPU 1 adds the bank number n with "1" (S118), and then returns to the step S113. Subsequently, the CPU 1 successively carries out the above operations until the check of all clusters of the final bank is terminated. If the CPU 1 determines that the bank is the final bank (S117: Yes), the CPU 1 returns the virtual RAM bank number to "0" (S119) and terminates the operation.

Figure 5:
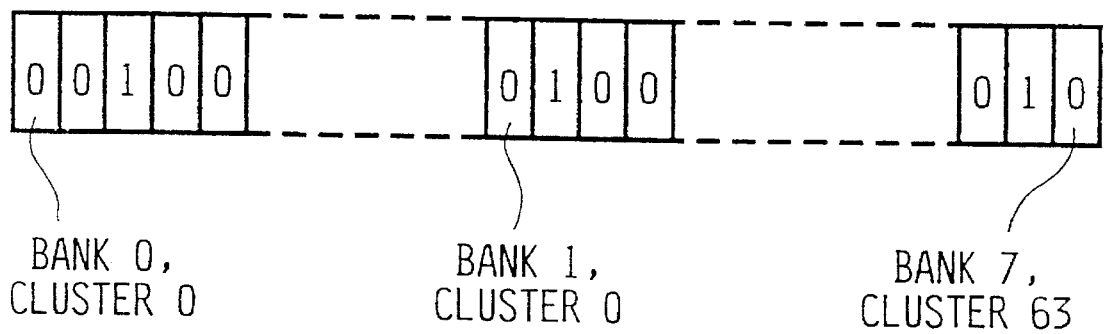
FIG. 5 is a schematic diagram showing a storage state of an EEPROM in this embodiment.

As described above for the virtual RAM bank 0, the cluster numbers "0" to "55", excluding the work area, are checked in every cluster. For the virtual RAM banks 1 to 7, the cluster numbers "0" to "63" are checked in every cluster. If the CPU 1 finds any cluster having defective bits (for example, an oblique-line portion of FIG. 2), as shown in FIG. 5, the CPU 1 sets "1" for the bits corresponding to the cluster number of the RAM information map area of the EEPROM. Accordingly, on the basis of the RAM information map area, all clusters can be classified to a cluster group having all normal bits (hereinafter referred to as a normal cluster group) and a cluster group having defective bits (hereinafter referred to as a defective cluster group) that can be discriminated from each other. When any normal cluster or bit-defective cluster is selected to preserve data, a searching operation is started from the position corresponding to the cluster number "0" of the RAM information map area, and the clusters are successively ensured in order starting from a smaller cluster number to a larger cluster number. The determination work of the virtual RAM bank 0 and the check work of the defective bits are generally carried out before the shipment of products from a factory.

The following four modes are mainly used as a reception method (hereinafter referred to as "reception mode", of the facsimile machine as described above.

A first reception mode is a "manual reception more, " in which the facsimile machine automatically functions as only a telephone, and a transmission and reception operation of a facsimile machine is manually carried out by a user.

A second reception mode is an "automatic reception mode" in which the facsimile machine automatically functions as only a facsimile machine, and automatically carries out a reception operation of a facsimile machine after a ring tone occurs at a predetermined number.

A third reception mode is a "FAX/TEL change-over mode". In this mode, although the facsimile machine basically carries out the reception operation, it delays the reception operation within a predetermined time while producing a ring tone as if it is in a reception state and carries out the reception operation after the predetermined time elapses.

A fourth reception mode is a "automatic answering mode" in which the facsimile machine carries out the reception operation as a caretaking telephone to transmit a response message to a transmission side. In this mode, it operates as a facsimile machine after a message from the transmission side is recorded.

Figure 6:
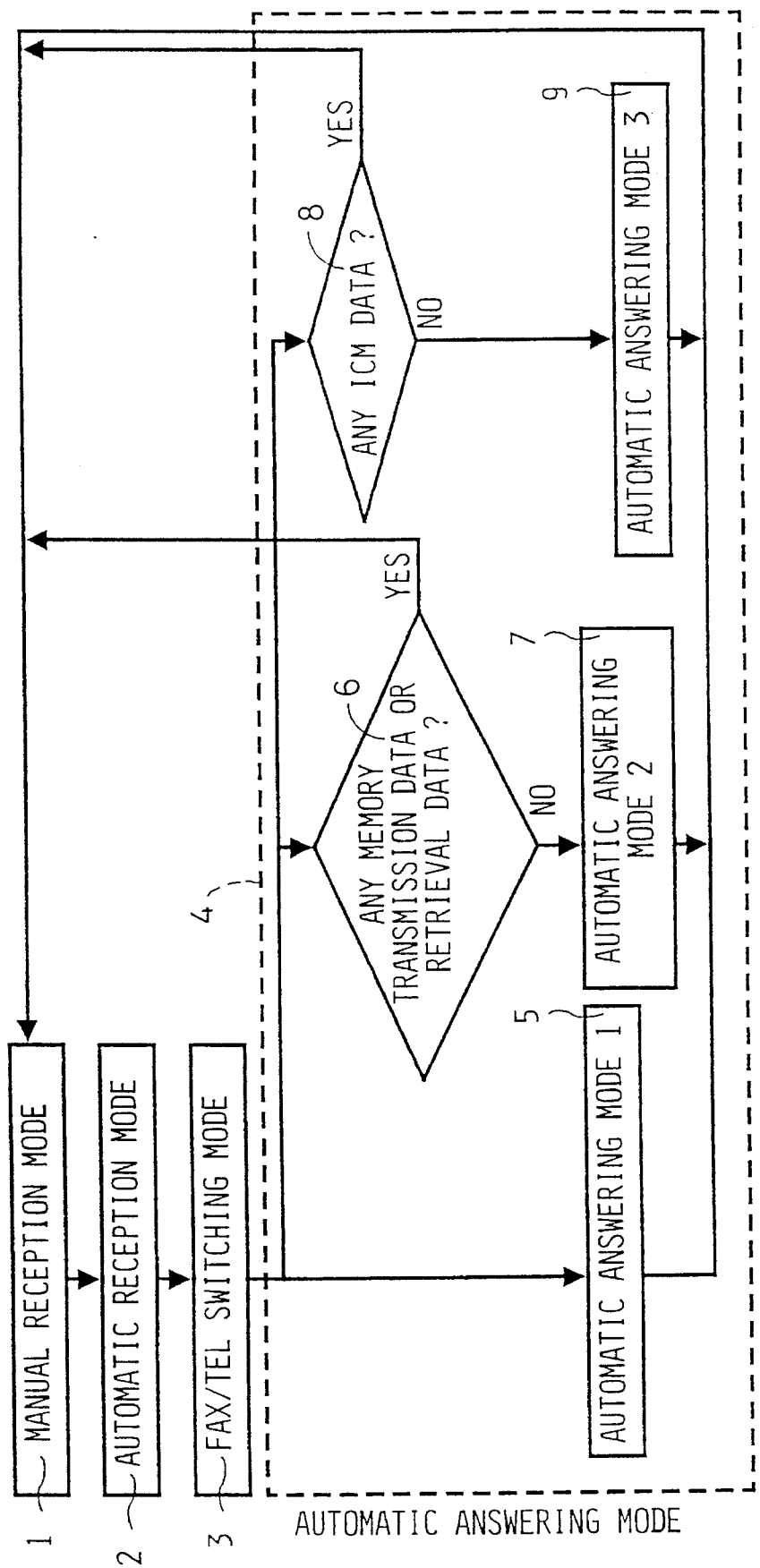
FIG. 6 is a flowchart for a switching operation of a reception mode in the facsimile machine of this embodiment.

The setting method of these reception modes will be described with reference to FIG. 6. The reception mode is successively switched to "manual reception mode", "automatic reception mode", "FAX/TEL switching mode" and "automatic answering mode", by pushing down a key "reception mode switch" (not shown) provided on a panel unit 10.

The "automatic answering mode" includes the following three modes.

In the first mode, all data such as ICM data, OGM data, intercepting data that is used for lack of sheets, timer memory transmission data, and retrieval data that can be taken out from a remote place by a remote controller, etc. are stored into the RAM 2.

In the second mode, voice data and intercepting data are stored in the RAM 2. Image data other than the intercepting data is not stored in the RAM 2.

In the third mode, image data and OGM data are stored in the RAM 2, and voice data other than the OGM data is stored in the RAM 2.

Any one of these modes is selected according to the desired use for the facsimile machine. However, when the reception mode is switched from another mode including the "manual reception mode", "the automatic reception mode", "the FAX/TEL switching mode", and "automatic answering mode 1" or "automatic answering mode 3" to "automatic answering mode 2", this switching operation to "automatic answering mode 2" would be inhibited if the timer memory transmission data or retrieval data has been already stored in the RAM 2.

When the reception mode is switched from another mode including the "manual reception mode", "the automatic reception mode", "the FAX/TEL switching mode" and "automatic answering mode 1" or "automatic answering mode 2" to "automatic answering mode 3", this switching operation to "automatic answering mode 3" would be inhibited if the ICM data has been stored in the RAM 2.

Figure 7:
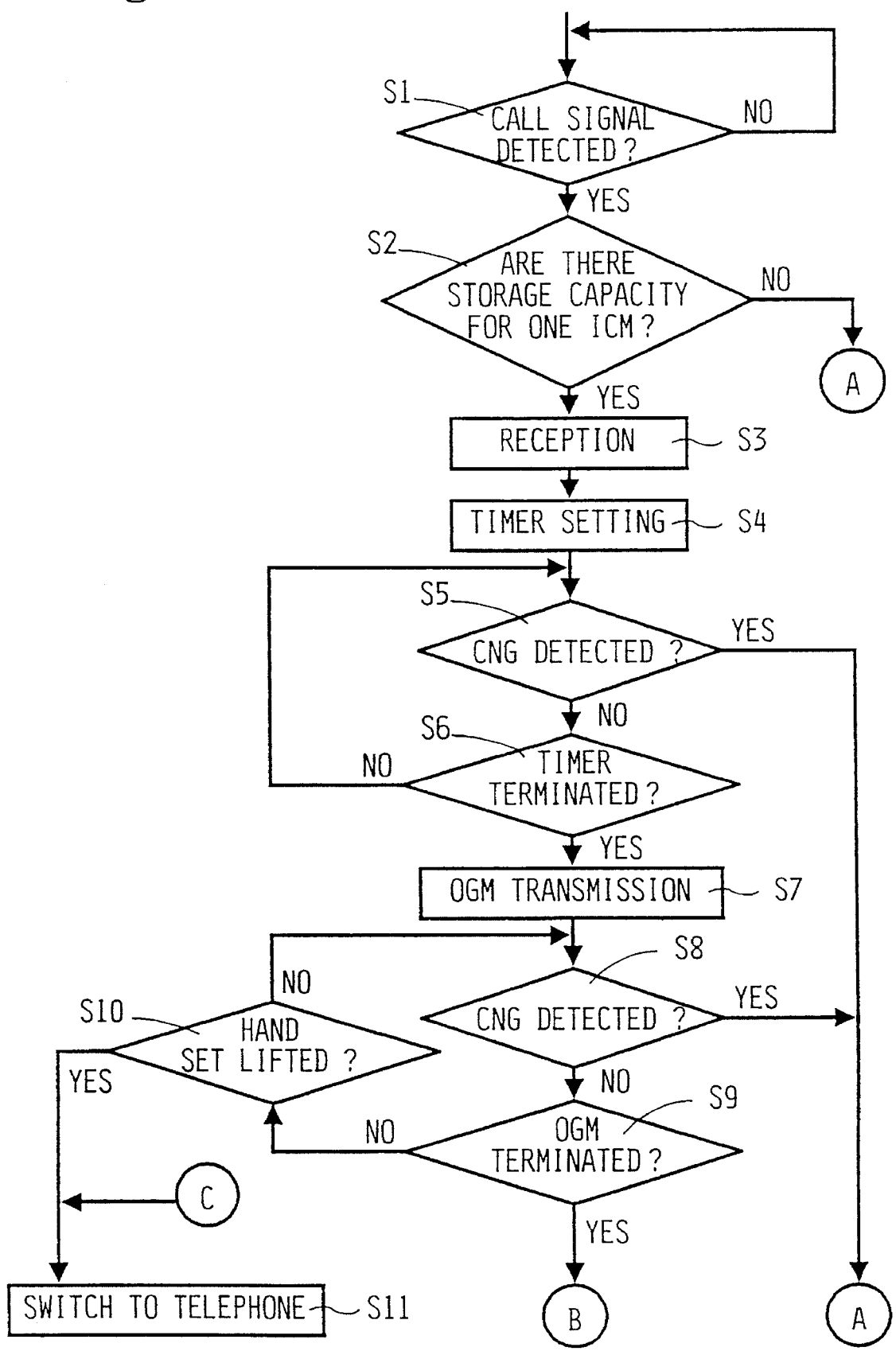
FIG. 7 is a flowchart for a reception operation when "automatic answering mode" in this embodiment is set.
Figure 8:
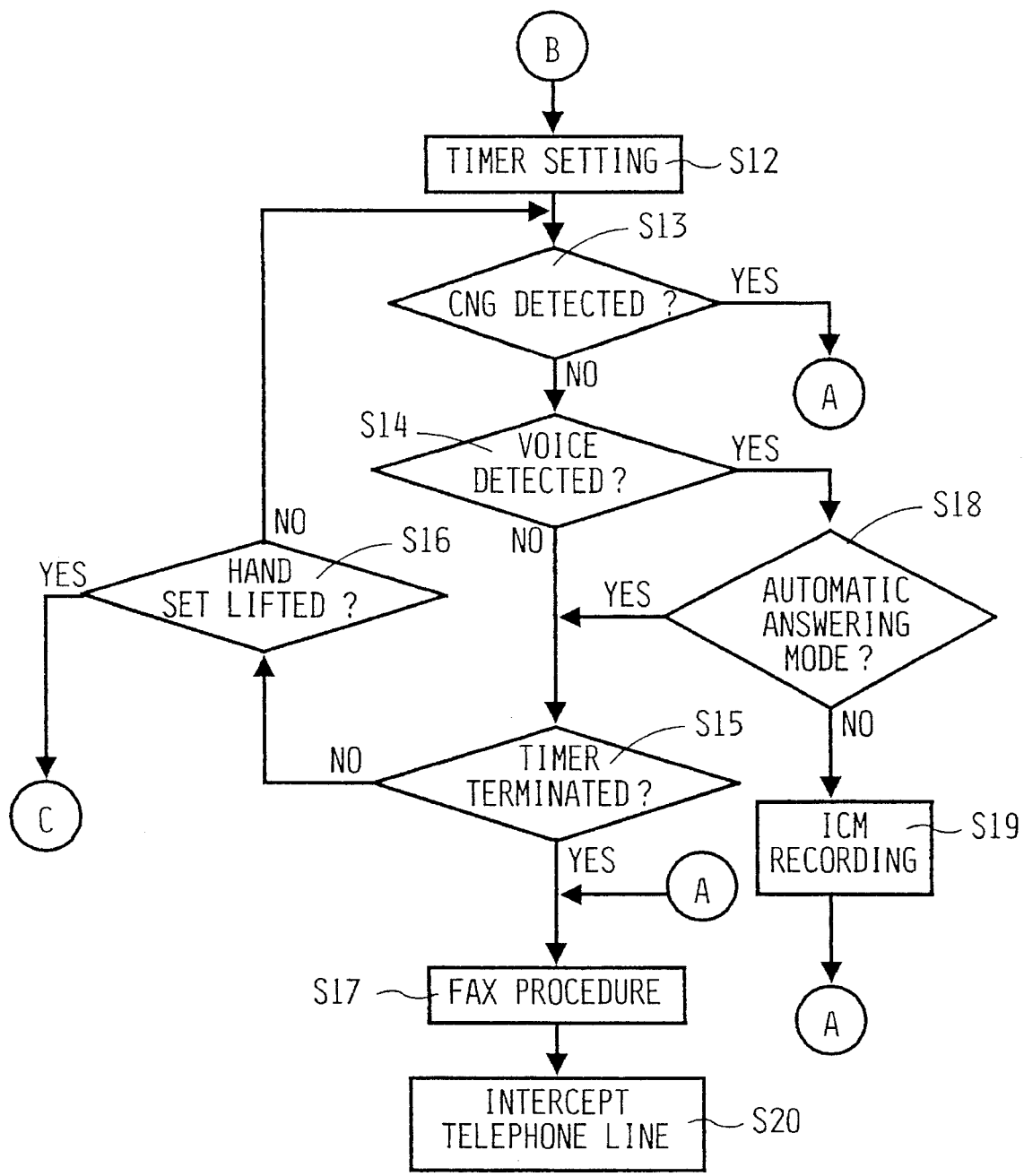
FIG. 8 is another flowchart for the reception operation when "automatic answering mode" in this embodiment is set.

Next, the reception operation of the facsimile machine when the reception mode is set to "automatic answering mode" by the above operation is described with reference to FIGS. 7 to 8.

First, when a call signal is detected by the CPU 1 (S1: Yes), the CPU 1 determines whether a memory capacity for one ICM, which is set beforehand, remains in the RAM 2 (S2). If the CPU 1 determines that no memory capacity for one ICM remains (S2: No), the CPU 1 transmits a called station identification signal (CED) to a calling side. Then, its facsimile procedure is started (S17). Upon termination of the facsimile reception, the CPU 1 intercepts the line (S20). On the other hand, if at the step S2 the CPU 1 determines that the memory capacity for one ICM remains (S2: Yes), the CPU 1 detects a call signal to carry out the reception operation (S3) and sets a timer for a predetermined time. Subsequently, the CPU I determines whether a ring phone signal (CNG) is detected (S5). If the CPU 1 determines that the CNG is not detected (S5: No), the CPU 1 determines whether the timer finishes its time counting operation (S6). If the CPU 1 determines that the CNG is detected within a predetermined time (S5: Yes, S6: No), the CPU 1 transmits a CED to the calling side, and starts its facsimile procedure (S17). Upon termination of the facsimile reception, the CPU 1 intercepts the line (S20). On the other hand, if the CPU 1 determines that no CNG is detected within the predetermined time (S5: No, S6: Yes), the CPU 1 transmits the calling side with the OGM, which is stored beforehand in the RAM 2 (S7). After transmitting the OGM to the calling side, the CPU 1 determines whether the CNG is detected (S8). If the CPU 1 determines that no CNG is detected (S8: No), the CPU 1 determines whether the transmission of the OGM is terminated (S9). If the CPU 1 determines whether the transmission of the OGM is not terminated (S9: No), the CPU 1 determines whether the hand set is lifted up (S10). If the CPU 1 determines that a CNG is detected before the transmission of the OGM is terminated (S8: Yes), the program of the CPU 1 goes to a step S17 as described above. If, the CPU 1 determines that the hand set is lifted up before the transmission of the OGM is terminated (S10: Yes), the CPU 1 switches the SW1 of the NCU 13 to the hand set 15 side to allow the facsimile machine to communicate with the calling side (S11).

On the other hand, if at the step S9, the CPU 1 determines that the transmission of the OGM is terminated (S9: Yes), the CPU 1 sets a predetermined time to the timer (S12). Subsequently, the CPU 1 determines whether the CNG is detected (S13). If the CPU 1 determines that no CNG is detected (S13: No), the CPU 1 determines whether a voice is detected (S14). If the CPU 1 determines that no voice is detected (S14: No), the CPU 1 determines whether the time counting operation of the timer is terminated (S15). If the CPU 1 determines that the time counting of the timer is not terminated (S15: No), the CPU 1 determines whether the hand set 15 is lifted up (S16). If the CPU 1 determines whether a CNG is detected within a predetermined time (S13: Yes, S14: No, S15: No, S16: No), the CPU 1 goes to the step S17 as described above. On the other hand, if the CPU 1 determines that the voice is detected with no detection of the CNG (S13; No, S14: Yes), the CPU 1 determines whether the facsimile machine is in "automatic answering mode 3" (S18). If the CPU I determines that the facsimile machine is in "automatic answering mode 3" (S18: Yes), the CPU 1 goes to step S15. On the other hand, if the CPU 1 determines that the facsimile machine is not in "automatic answering mode 3" (S18: No), that is, the CPU 1 determines that the facsimile machine is in "automatic answering mode 1" or "automatic answering 2", the CPU 1 records the ICM in the RAM 2 (S19) and then goes to the step S17 as described above. After starting the facsimile procedure, the CPU 1 intercepts the telephone line (S20). If the CPU 1 determines that the hand set 15 is lifted up within the predetermined time (S16: Yes), the CPU 1 goes to the step S11. On the other hand, if the CPU 1 determines whether the time counting of the timer is terminated (S15: Yes), that is, if the CPU 1 determines the lapse of the predetermined time after transmitting the OGM to the calling side, the CPU 1 goes to the step S17 as described above and transmits a CED to the calling side to start the facsimile procedure.

As is apparent from the above description, when the CNG is detected within a predetermined time after having a call or when a predetermined time elapses with no detection of a voice or with no detection of the lift-up of the hand set, the facsimile machine of this embodiment transmits the CED to start the facsimile machine, and received image data is stored in the RAM 2. Further, when any voice is detected within the predetermined time, the voice data is stored in the RAM 2. For the voice data, even if several bits out of the bits constituting a cluster are not accurately reproduced, it hardly affects the quality of the voice, which is subjected to a digital/analog (D/A) conversion and then output from the speaker 16. Therefore, in this embodiment, a D-RAM, which is not guaranteed in quality, that is, which may partially contain defective bits, is used as the RAM 2 as a storage medium for storing voice data and image data. It is noted that a RAM having all normal bits may be used.

For a RAM with partially defective bits, each cluster is checked beforehand to determine whether any defective bit exists in the cluster as described above. The presence or absence of any defective bit in each cluster is stored as identification information for the cluster into a RAM information map area of the EEPROM 4. On the basis of the identification information, the CPU 1 treats a cluster as a defective cluster when the cluster any defective bit, and treats a cluster as a normal cluster when the cluster has no defective bit. Every time data is input, the CPU 1 identifies the input data as voice data or image data. According to the classification (kind) of the data, and the CPU 1 selects a cluster into which the data is to be recorded.

The presence and absence of any defective bit may be discriminated from each other using memory addresses. That is, when both a normal RAM and a bit-defective RAM are installed in the facsimile machine, the image data is stored in the normal RAM while the voice data is stored in the bit-defective RAM.

Figure 9:
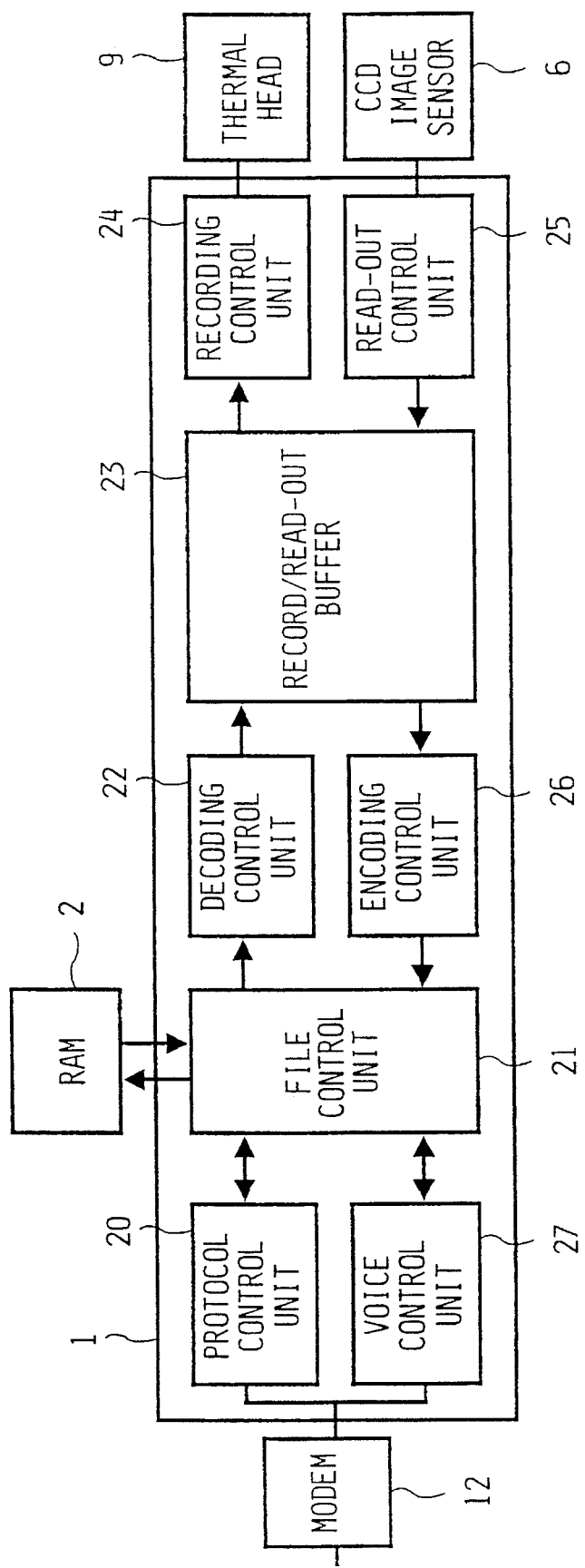
FIG. 9 is a block diagram showing a mechanism for carrying out an input/output control of an image data in this. embodiment.
Figure 10:
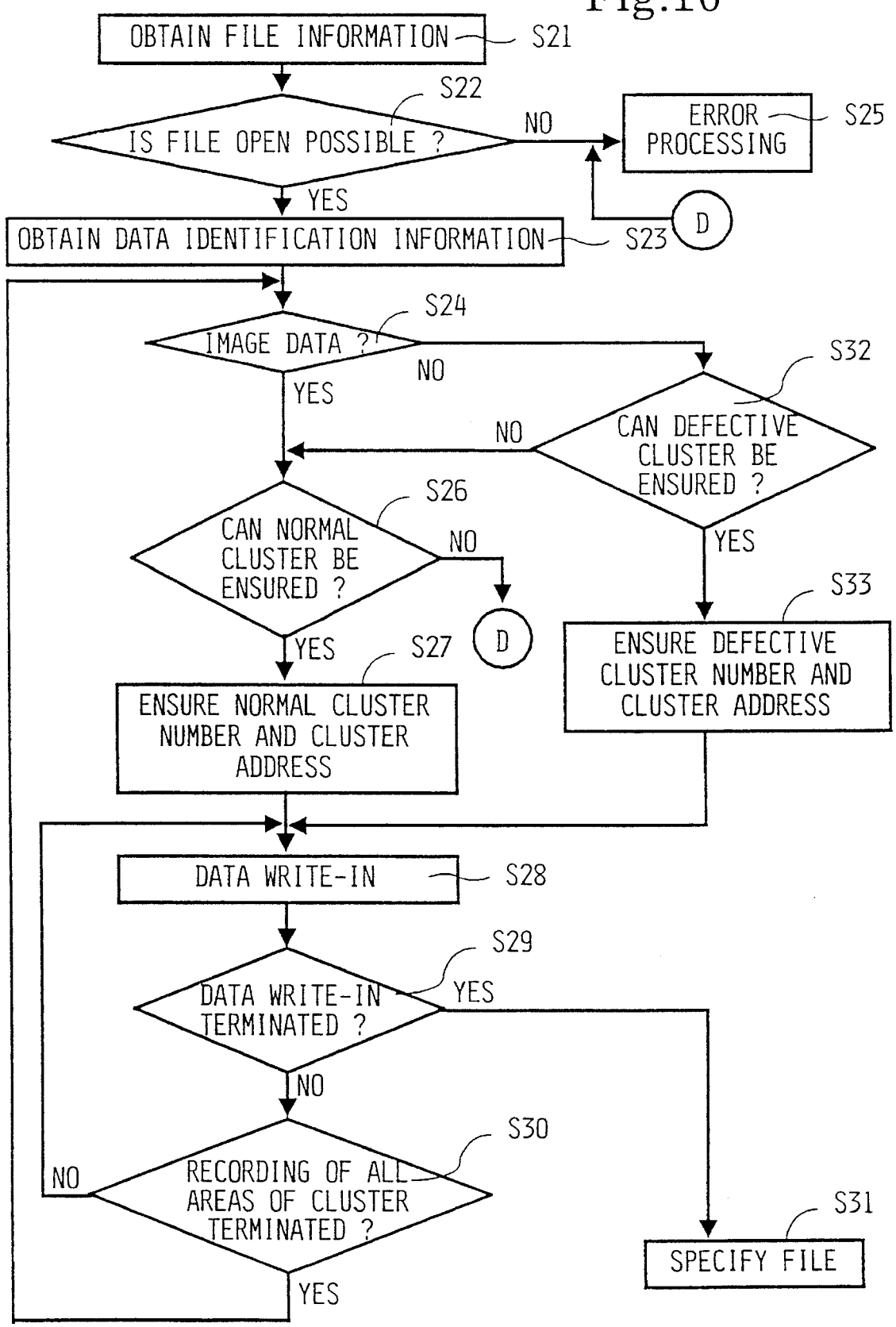
FIG. 10 is a flowchart for a write-in operation into a RAM in a file control unit of this embodiment.

Next, the input/output control operation of the voice data and the image data is described referring to FIGS. 9 to 10. First, the input/output control operation of the image data is described.

Upon reception of the image data through the telephone line 14 (see FIG. 1), the SW1 and the SW2 are switched to the modem 12 side, and the image data is input to the modem 12. The image data is converted from analog signals to digital signals in the modem 12 and passed through a protocol control unit 20 to a file control unit 21 to be subjected to a write-in processing into the RAM 2.

The write-in processing into the RAM 2 in the file control unit 21 is described with reference to FIG. 10. First, the file control unit 21 obtains file information from the RAM 2 (S21), and it is determined whether the file can be opened (S22). If the file control unit 21 determines that the file can be opened (S22: Yes), the file control unit 21 obtains classification information for the input data (S23) and determines whether the input data is image data (S24). On the other hand, if the file control unit 21 determines that the file cannot be opened (S22: No), the file control unit 21 carries out an error processing (S25).

When the protocol control unit 20 is actuated at the step S24, the file control unit 21 determines that the input data is the image data (S24: Yes). Based on the identification information for each cluster stored in the RAM information map area of the EEPROM 4, the file control unit 21 determines whether any normal cluster can be selected (S26). If the file control unit 21 determines that any normal cluster can be selected (S26: Yes), the file control unit 21 selects a normal cluster number and a cluster address thereof (S27) to carry out the write-in operation of the image data into the normal cluster (S28). On the other hand, if the file control unit 21 determines that no normal cluster can be selected (S26: No), the error processing is executed at the step S25.

After the file control unit 21 carries out the write-in operation of the image data into the normal cluster (S28), the file control unit 21 determines whether the write-in operation of the image data into the normal cluster is terminated (S29). If the file control unit 21 determines that the write-in operation of the image data into the normal cluster is terminated (S29: Yes), the file control unit 21 specifies a file and stores a file type as "reception file format" into the RAM 2 (S31). If the file control unit 21 determines that the write-in operation of the image data into the normal cluster is not terminated (S29: No), the file control unit 21 determines whether the storage (recording) into all areas of the cluster is terminated (S30). If the file control unit 21 determines the termination of the storage into all the areas of the cluster (S30: Yes), the file control unit 21 executes the processing from the step S24 again to carry out an operation for selecting another cluster. On the other hand, if the file control unit 21 determines that the storage (recording) into all the areas of the cluster is not terminated (S30: No), the file control unit 21 repetitively executes the loop from the step S28 to the step S30 until the data write-in operation is terminated or the recording into all the areas of the cluster is terminated.

After the received image data is stored in the RAM 2 and coded through the operation described above, a control unit 22 obtains a cluster number and cluster address information from the file control unit 21, which indicate a storage place of the image data. The image data is accessed from the RAM 2 on the basis of the information to decode the accessed image data according to a predetermined procedure.

The decoded image data is temporarily stored in a record/read-out buffer 23, and a recording control unit 24 controls the driving of the thermal head 9 to record the image on a sheet. When the decoding of one-communication data by the decoding control unit 22 is terminated, the file is entirely erased by the file control unit 21. If a sheet deficiency is detected by a detector (not shown) during the above recording operation, information on the sheet deficiency is input to the protocol control unit 20. A signal indicating that the recording is impossible is then transmitted to the calling side, and, at the same time, the decoding control unit 22 ends its control operation. The image data stored in the RAM 2 is preserved in the RAM 2 as is, and the file type is altered to "intercepting file format" by the file control unit 21. Upon supplement of sheets by a user, the data decoding operation of the decoding control unit 22 is resumed.

In the reception of the image data as described above, when the retrieval function is set to ON while the reception mode is set to "automatic answering mode 1 or 3" regardless of the presence of sheets, the file control unit 21 does not erase the file even when the recording on the sheet by the recording control unit 24 is terminated. The file type is preserved as "retrieval file format". When one of a plural retrieval files is specified by the remote control operation, the specified retrieval file is taken out from the RAM 2, and transmitted to the calling side.

On the other hand, the image data that is read out through the control of the driving of the CCD image sensor 6 by the read-out control unit 25 is temporarily stored in the read-out buffer 23. It is encoded according to a procedure that is determined by an encoding control unit 26. The encoded image data is stored into the RAM 2 through the same processing as described above which is carried out by the file control unit 21, and the file type is preserved as "memory transmission file format". The data stored in the RAM 2 is passed through the protocol control unit, then converted from digital signals to analog signals in the modem 12, and then transmitted through the telephone line 14. After the transmission of one-comunication data is terminated, the file is entirely erased by the file control unit 21.

Next, the input/output control operation of the voice data is hereunder described. When the voice data is input through the telephone line 14 into the facsimile machine, SW1 and SW2 are switched to the modem 12 side, and the voice data is input to the modem 12. The voice data is converted from analog signals to digital signals in the modem 12, then passed through a voice control unit 27. The converted data is then subjected to the write-in operation into the RAM 2 as shown in FIG. 10 in the file control unit 21. However, if the voice control unit 27 is actuated at the step S24 of FIG. 10, the received data is determined not to be the image data (S24: No). Thus, on the basis of the identification information corresponding to each cluster stored in the RAM information map area of the EEPROM 4, the file control unit 21 determines whether any defective cluster, that is, a cluster having any defective bit can be selected (S32). If the file control unit 21 determines that the defective cluster can be selected (S32: Yes), the file control unit 21 selects a defective cluster number and a cluster address (S33) and writes the voice data into the defective cluster of the RAM 2 (S28). Subsequently, the file control unit 21 carries out the same operation as described above. If the write-in operation of the voice data into the defective cluster is terminated (S29: Yes), the file control unit 21 specifies the file and preserves the voice data as "ICM format" when the voice data is an ICM and as "OGM format" the voice data is an OGM (S31). If the file control unit 21 determines that any defective cluster cannot be selected (S32: No), the file control unit 21 goes to a step S26. The same operation as described above is carried out, and, if any normal cluster can be selected, the file control unit 21 preserves the voice data into the normal cluster.

The OGM data, which is stored in the RAM 2 through the above operation, is automatically transmitted from the RAM 2 through the CPU 1 and subjected to the D/A conversion in the modem 12 when the storage processing for the OGM data is terminated. The OGM data thus converted is reproduced as a voice from the speaker 16 through the switching operation of the SW2 to the external speaker 16 side. Through this operation, the user can confirm the preservation (storage) quality of the OGM data. If the telephone is received in "automatic answering mode", OGM is automatically reproduced after a CNG detection period (non-voice period) of several seconds elapses. Then, it is transmitted from the RAM 2 through the CPU I to the modem to be subjected to the D/A conversion. Subsequently, the SW2 is switched to the NCU 13 side, and the SW1 is switched to the modem 12 side, so that the OGM is transmitted to a calling side. The ICM data stored in the RAM 2 is successively reproduced in a storage order by pushing down a "play key" (not shown) provided on the panel unit 10 in a facsimile standby state and is transmitted through the CPU 1 to the modem 12 to be subjected to the D/A conversion. Subsequently, the SW2 is switched to the external speaker 16 side, and the ICM is output as a voice from the speaker 16.

As described above, the D-RAM having partially defective bits is used as the storage medium for the voice data and the image data, and the selection of a cluster to be used to preserve data is made according to the classification (kind) of the data. In addition, only normal clusters having no defective bits are used to store image data. On the other hand, defective clusters having defective bits are preferentially used to store voice data, and normal clusters are used if all the defective clusters have been used. Accordingly, even if a RAM having partially defective bits is used as a storage medium for storing voice and image data, the data preservation (storage) quality can be kept high. Further, by using a random-accessible RAM, an access speed can be more heightened. Thus, the working efficiency can be improved. In addition, even if a RAM is used as a storage medium, an inexpensive facsimile machine can be achieved. Further, a file type is allocated to each data to be stored in the RAM for every data classification (kind), so data management such as erasing of individual data, preservation of specific data, etc. can be facilitated. Also, any RAM having no defective bit can be used. Still further, the facsimile machine may be equipped with both a normal RAM and a RAM having partially defective bits to store the image data into the normal RAM and to store the voice data into the partially bit-defective RAM.

Figure 11:
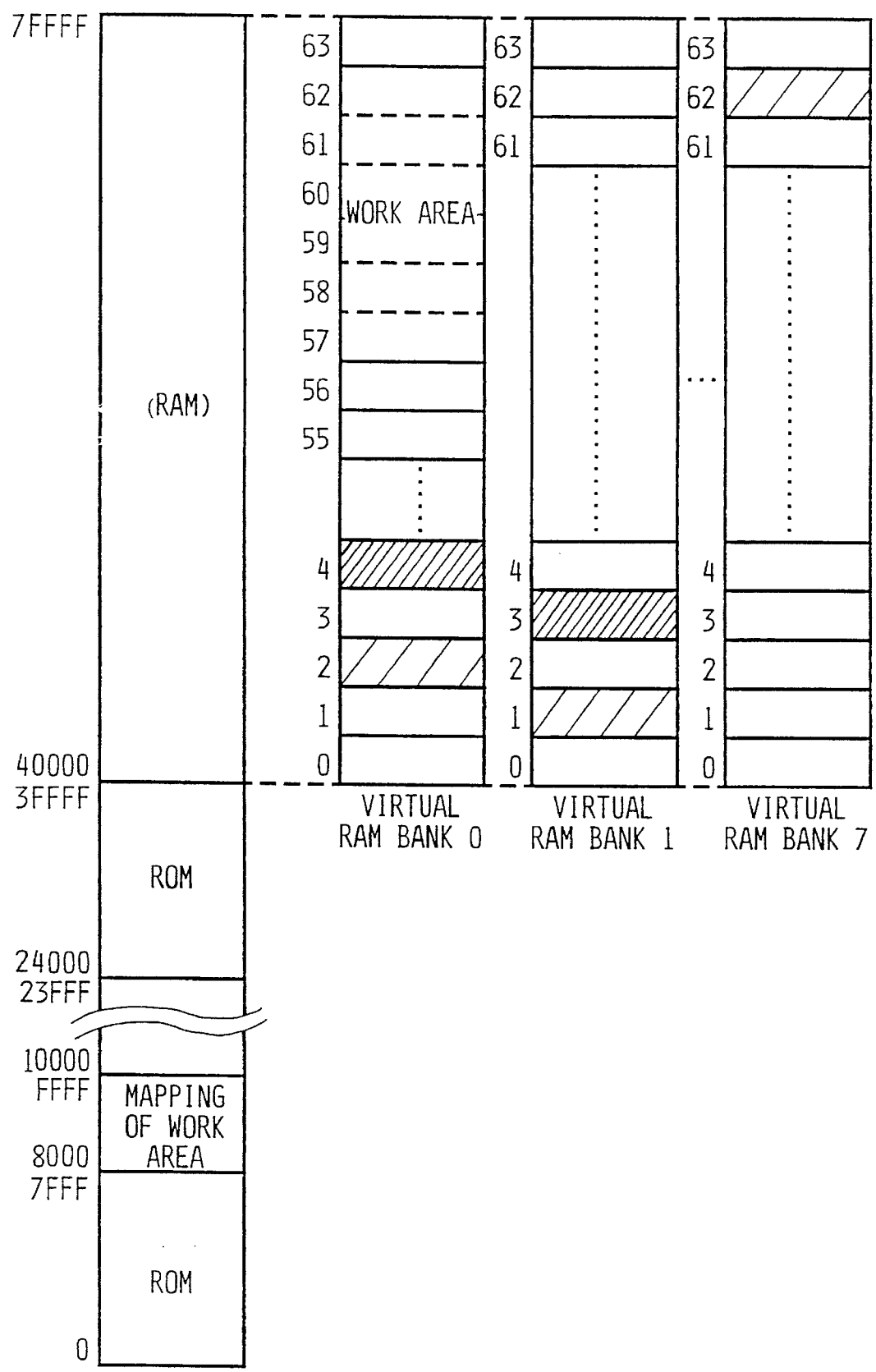
FIG. 11 is a schematic diagram for a memory map of a RAM in another embodiment.

When any cluster having extremely high bit-defection rate exists and the voice data is stored in such a cluster, there may occur a case where sufficient voice quality is not guaranteed in even the above facsimile machine. For example, as shown in FIG. 11, the cluster "2" of the virtual RAM bank 0 or the cluster "1" of the virtual. RAM bank 1 is a cluster (as indicated by a light oblique-line portion) having a bit-defection rate less than 10%. The cluster "4" of the virtual RAM bank 0 or the cluster "3" of the virtual RAM bank 1 is a cluster (indicated by a dark oblique-line portion) having a bitdefection rate 10% or greater. In this case, if the voice data is stored in the cluster having bit-defection rate 10% or greater, sufficient voice quality cannot be guaranteed.

Figure 12:
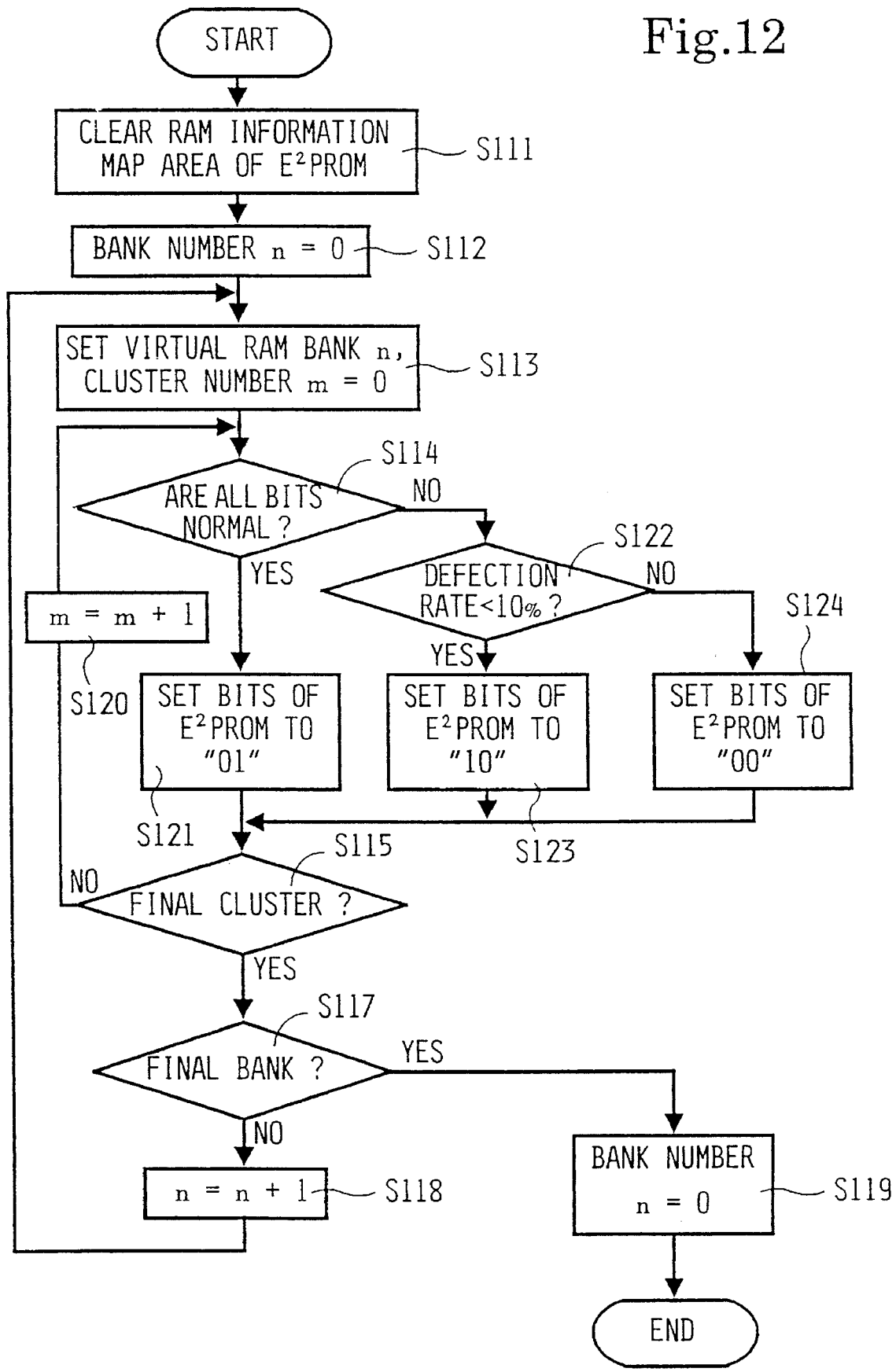
FIG. 12 is a flowchart for a write-in operation into a RAM information map area in another embodiment.

Accordingly, as described later, the data management may be carried out by classifying (discriminating) all clusters into a first cluster group containing clusters each having all normal bits, a second group containing clusters whose bit-defection rate is less than a predetermined value, and a third cluster group containing clusters whose bit-defection rate is above the predetermined value. That is, as shown in FIG. 12, the determining operation of the virtual RAM bank may be carried out. The determining operation of the virtual RAM bank has the same steps as the above determining operation up to step (S114). Thus, it will not be described in detail here.

The CPU 1 determines whether all bits of the cluster number m are normal in the virtual RAM bank n (S114). If the CPU 1 determines that all the bits of the cluster number m are normal in the virtual RAM bank n (S114: Yes), the CPU 1 sets to "01" the bits corresponding to the cluster number m of the virtual RAM bank n of the RAM information of the EEPROM 4 (S121). Then, the CPU 1 goes to a step S115.

On the other hand, if the CPU 1 determines that all the bits of the cluster number m are not normal (S114: No), then the CPU 1 determines whether the bit-defection rate for all the bits of the cluster number m is less than 10% (S122). If the CPU 1 determines that the bit-defection rate for all the bits of the cluster number m is less than 10% (S122: Yes), the CPU 1 sets to "10" the bits corresponding to the cluster number m of the virtual RAM bank n (S123). If the CPU 1 determines that the bitdefection rate of all the bits of the cluster number m is 10% or greater (S122: No), the CPU 1 sets to "00" the bits corresponding to the cluster number m of the virtual RAM bank n (S124). Subsequently, the CPU 1 executes the step S115. At the step S115, the CPU 1 determines whether the cluster is the final cluster (S115). If the CPU 1 determines that the cluster is not the final cluster (S115: No), the CPU 1 adds the cluster number m with "1" (S120) and returns to the step S114. Subsequently, the CPU 1 successively checks all the clusters up to the final cluster.

If the CPU 1 determines that the check of the bits of the final cluster is terminated (S115: Yes), then the CPU 1 determines whether the bank is the final bank, that is, the number of the bank is the bank number "7" (S117). If the CPU 1 determines that the bank is not the final bank (S117: No), the CPU 1 adds the bank number n with "1" (S118) and returns to the step S113. Subsequently, the CPU 1 successively repeats the above operation until the check of all the clusters of the final bank is terminated. On the other hand, if the CPU 1 determines that the bank is the final bank (S117: Yes), the CPU 1 clears the virtual RAM bank number to zero (S119) and then finishes the operation.

Figure 13:
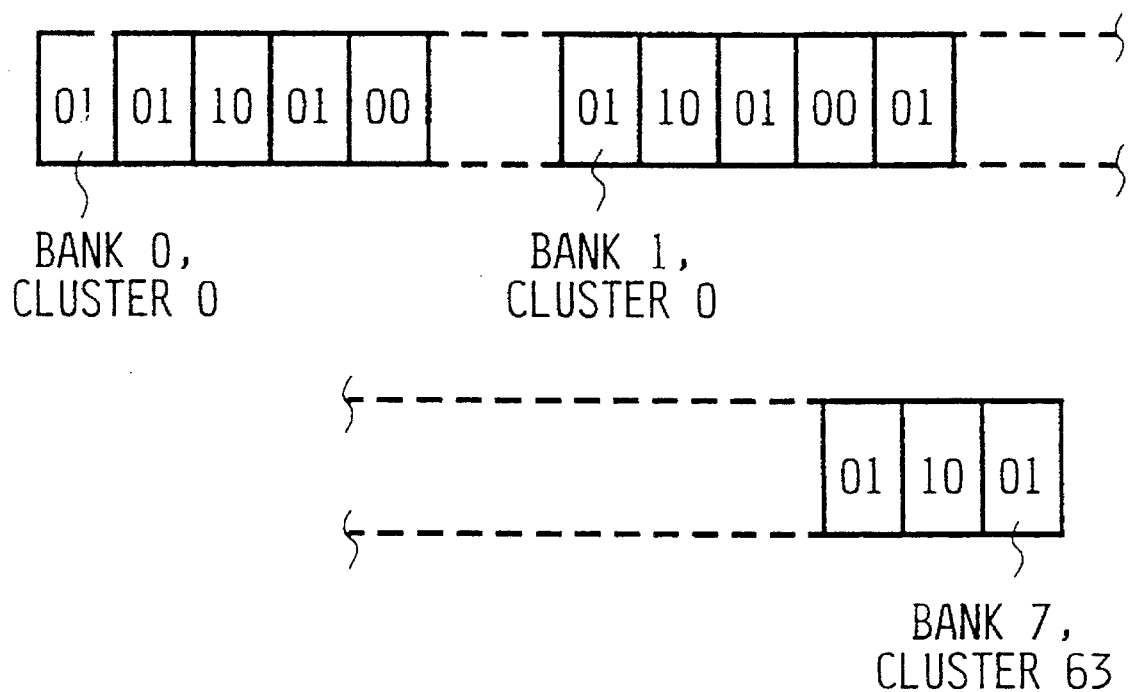
FIG. 13 is a schematic diagram showing a storage state of an EEPROM in another embodiment.
Figure 14:
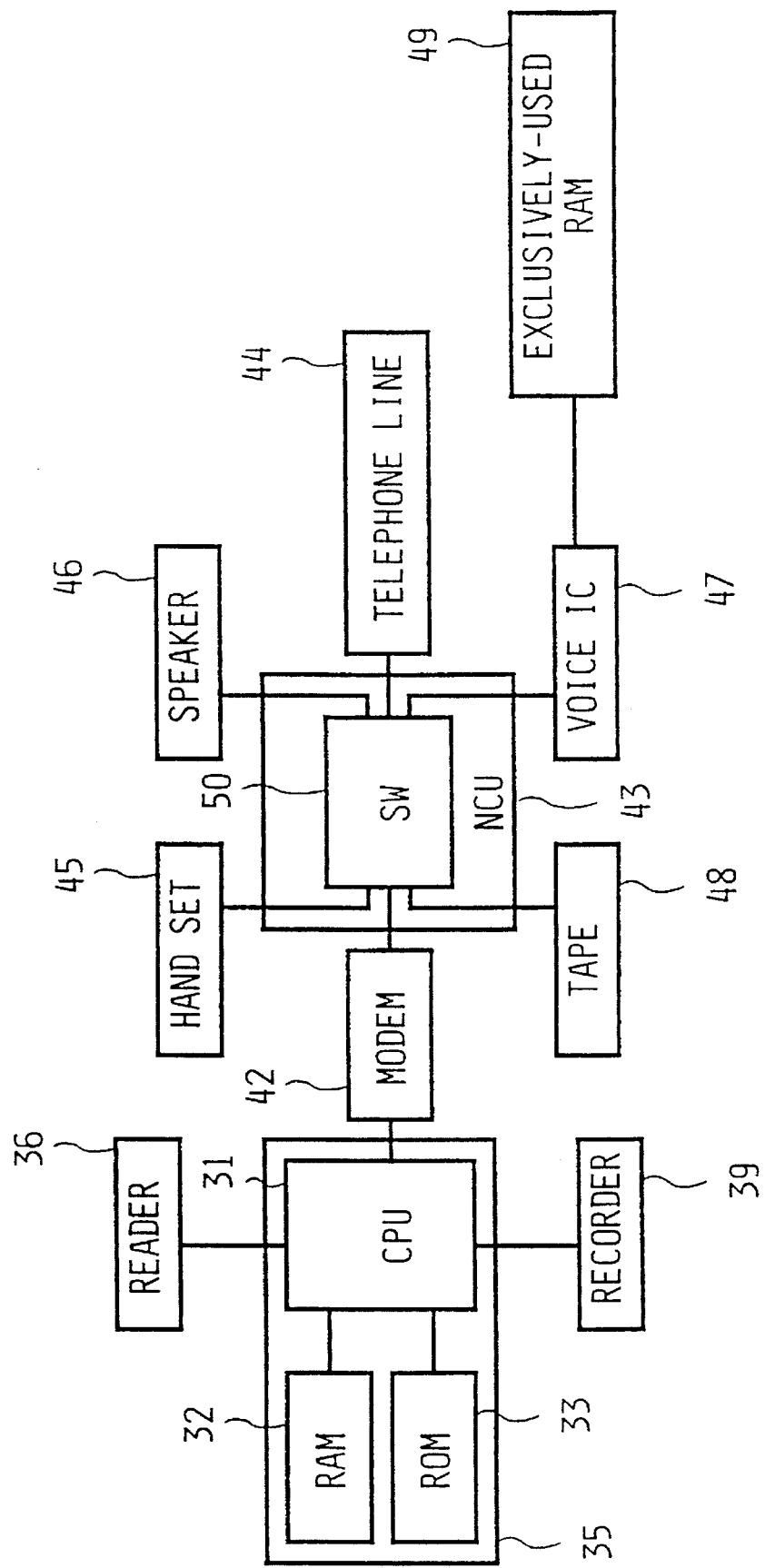
FIG. 14 is a block diagram showing the main construction of a control unit of a conventional facsimile machine.

As described above, the cluster numbers 0 to 55 excluding the work area are checked at every cluster in the virtual RAM bank 0, and the cluster numbers 0 to 63 are checked at every cluster in the virtual RAM banks I to 7. The bit information of each cluster is written in the RAM information map area of the EEPROM as shown in Fig. 13. That is, the bits corresponding to each cluster number of the RAM information map area of the EEPROM is set to "01" when all the bits of the cluster are normal, "10" when any bit defection exists but the bit-defection rate is less than 10%, or "00" when the bit-defection rate is 10% or greater. Accordingly, the bit-defective state of each cluster can be identified by the RAM information map area of the EEPROM. When any normal cluster or bit-defective cluster is selected to preserve data, the searching operation is carried out from the position of the RAM information map area that corresponds to the cluster number "0" and the clusters are selected in order from a smaller cluster number to a larger cluster number. Therefore, the same reception operation of the facsimile machine as the above embodiment is carried out.

As described above, the selection of the clusters to be used to preserve data can be made according to the classification (kind) of the data. When the image data is stored, only the normal clusters having no bit defection are allocated to the image data, and when the voice data is stored, those defective clusters that have any bit defection but a bit-defection rate less than 10% are preferentially allocated to the voice data. In this case, if all the defective clusters have been used, normal clusters are allocated. Further, those clusters which have a bit-defection rate 10% or greater are not used even for preservation (storage) of the voice data. Therefore, even when a RAM that may partially have defective bits is used as a storage medium for storing voice data and image data, the data preservation (storage) quality can be even better performed than in the first embodiment as described above. This invention is not limited to the embodiments as described above, and various modifications may be made without departing from the subject matter of this invention.

For example, in the above embodiments, for storage of the voice data, the defective cluster having any bit defection is preferentially used, and if no defective cluster exists, the normal cluster is used. In place of this method, a method may be used in which only the defective clusters are used for the voice data and the normal clusters are exclusively used for the image data. Further, any defective cluster may not be used.

Further, in the above embodiments, when a cluster has a bit-defection rate 10% or greater, the cluster is not used as a defective cluster for preservation of the voice data. However, the threshold value for determining the defective cluster is not limited to 10%, and it may be suitably selected according to a coding system for the voice data.

What is claimed is:

1. A data management system in a data receiving and storage assembly comprising:

a semiconductor memory that stores data in clusters of bits;

a bit determiner that determines whether each cluster has a defective bit;

a cluster identifier that identifies any clusters with at least one defective bit as a defective bit cluster and identifies clusters with no defective bits as a normal bit cluster;

a data classifier that classifies data to be stored in said semiconductor memory as data that requires accurate reproduction and as data that does not require accurate reproduction; and a data controller that allocates data for storage into clusters based on the identification of a cluster and the classification of the data, wherein data that requires accurate reproduction is allocated into a normal bit cluster and data that does not require accurate reproduction is allocated into a defective bit cluster when available.

2. The data management system of claim 1, wherein said semiconductor memory includes a work area that is directly accessible to said data controller and a storage area that comprises said clusters of normal bit clusters and defective bit clusters.

3. The data management system of claim 1, wherein said data classifier classifies defective bit clusters in groups based on a predetermined rate of bit defection.

4. The data management system of claim 1, wherein said data controller allocates image data to said normal bit clusters and allocates voice data to said bit-defective clusters.

5. A management system for a semiconductor memory having a storage area divided into cluster units each having a constant memory capacity, comprising:

determining means for determining whether all bits are normal in every cluster unit;

setting means for setting at least one cluster unit as a system area having all normal bits as determined by said determining means, and for setting the other cluster units as a data preservation area; and managing means for managing the cluster units by identifying any cluster units having all normal bits and any cluster units having any defective bit in each cluster unit of said data preservation area and allocating data to be stored into a cluster unit based on the identification.

6. The management system of claim 5, wherein said managing means allocates data that requires accurate storage and reproduction to the cluster units having all normal bits and allocates data that does not require accurate storage and reproduction to the bit-defective cluster units when available.

7. The management system of claim 5, wherein said managing means allocates image data for a facsimile machine to the cluster units having all normal bits and allocates voice data for a telephone having an automatic answering mode to the bit-defective cluster units.

8. The management system of claim 5, wherein said managing means further identifies defective bit cluster units based on a predetermined rate of bit defection.

9. A facsimile machine comprising:

a semiconductor memory that stores voice data and image data;

a first manager that divides said semiconductor memory into clusters, identifies each of said clusters, and manages the identification of each cluster;

an identifier that classifies and identifies the classification of data stored in said semiconductor memory;

a storage determiner that determines one or plural clusters for storage use in said semiconductor memory, wherein said clusters are set for storage based on the identification of said clusters by said first manager and the identification of the classification of data by said identifier; and a second manager that sets up and manages a file of said clusters determined by said storage determiner according to the classification of the data.

10. The facsimile machine of claim 9 wherein said identifier classifies data based on storage and reproduction accuracy requirements.

11. The facsimile machine of claim 9 wherein said first manager examines each of the clusters, determines whether a cluster has any defective bits, and identifies each cluster as a normal bit cluster or a defective bit cluster.

12. The facsimile machine of claim 11 wherein said storage determiner allocates data into one of a normal bit cluster and a defective bit cluster based on the classification of the data by the identifier.

13. The facsimile machine of claim 12 wherein said identifier classifies data into voice data and image data and wherein said storage determiner allocates image data into normal bit clusters and voice data into any defective bit clusters.

14. The facsimile machine of claim 9 wherein said first manager identifies clusters based on presence and rate of bit defection.

15. A facsimile machine comprising:

a semiconductor memory means for storing voice data and image data;

first management means for dividing said semiconductor memory into clusters, identifying said clusters and managing the identification of each cluster so that all of said clusters are appropriately classified into a first cluster group of clusters having all normal bits, a second cluster group of clusters having bit defection with a bit-defection rate less than a predetermined value, and a third cluster group of clusters having bit defection with a bit-defection rate above the predetermined value;

identifying means for classifying data and identifying the classifications of data stored in said semiconductor memory means;

setting means for setting one or plural clusters for data storage use according to the classification of the data based on the identification of each of said clusters; and second management means for creating and managing a file of said clusters set by said setting means according to the classification of the data.

* * * * *